(12) United States Patent
Yamaguchi et al.

(10) Patent No.: US 6,486,519 B2
(45) Date of Patent: Nov. 26, 2002

(54) SEMICONDUCTOR MEMORY DEVICE WITH REDUCE COUPLING CAPACITANCE

(75) Inventors: Tadao Yamaguchi, Tokyo (JP); Tadayoshi Nakano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/758,806

(22) Filed: Jan. 16, 2001

(65) Prior Publication Data

US 2002/0024831 A1 Feb. 28, 2002

(30) Foreign Application Priority Data

Aug. 11, 2000 (JP) ........................................ 2000-244917

(51) Int. Cl.$^7$ ............................................... H01L 29/76
(52) U.S. Cl. ...................................... 257/390; 257/368
(58) Field of Search .............................. 365/63, 69, 52; 257/390, 368, 208, 905, 906, 907

(56) References Cited

U.S. PATENT DOCUMENTS 5,457,648 A * 10/1995 Eisig ............................ 365/63
5,608,241 A * 3/1997 Shibuya et al. ............. 257/207
5,808,338 A * 9/1998 Gotou .......................... 257/315
6,107,666 A * 8/2000 Chang .......................... 257/391
6,333,889 B1 * 12/2001 Arimoto ................. 365/230.03

FOREIGN PATENT DOCUMENTS

| JP | 4-340271 | 11/1992 |
|---|---|---|
| JP | 10-22402 | 1/1998 |

* cited by examiner

*Primary Examiner*—Hoai Ho
*Assistant Examiner*—Gene N. Auduong
(74) *Attorney, Agent, or Firm*—Burns, Doane, Swecker & Mathis, LLP (57) ABSTRACT

The semiconductor memory device comprising a plurality of memory cells aligned in a matrix form, and a plurality of bit lines respectively extending along the memory cells aligned in the longitudinal direction, wherein each of the bit lines is provided with a line section of the upper layer and that of the lower layer, and the mutually adjacent portions of the respectively adjacent two bit lines are provided in the different layers from each other. Due to this construction, such a conventional problem that the specific gravity of the coupling capacitance occupied within the whole bit-line capacitance is made large and an erroneous operation is caused due to this narrowed coupling capacitance can be solved.

7 Claims, 7 Drawing Sheets

SEMICONDUCTOR MEMORY DEVICE WITH REDUCE COUPLING CAPACITANCE

BACKGROUND OF THE INVENTION

1. Field of the Invention

The present invention relates to a semiconductor memory device, and more particularly relates to a semiconductor memory device provided with a bit line configuration by which a coupling capacitance between mutually adjacent bit lines can be reduced.

2. Description of the Related Art

Figure 5:
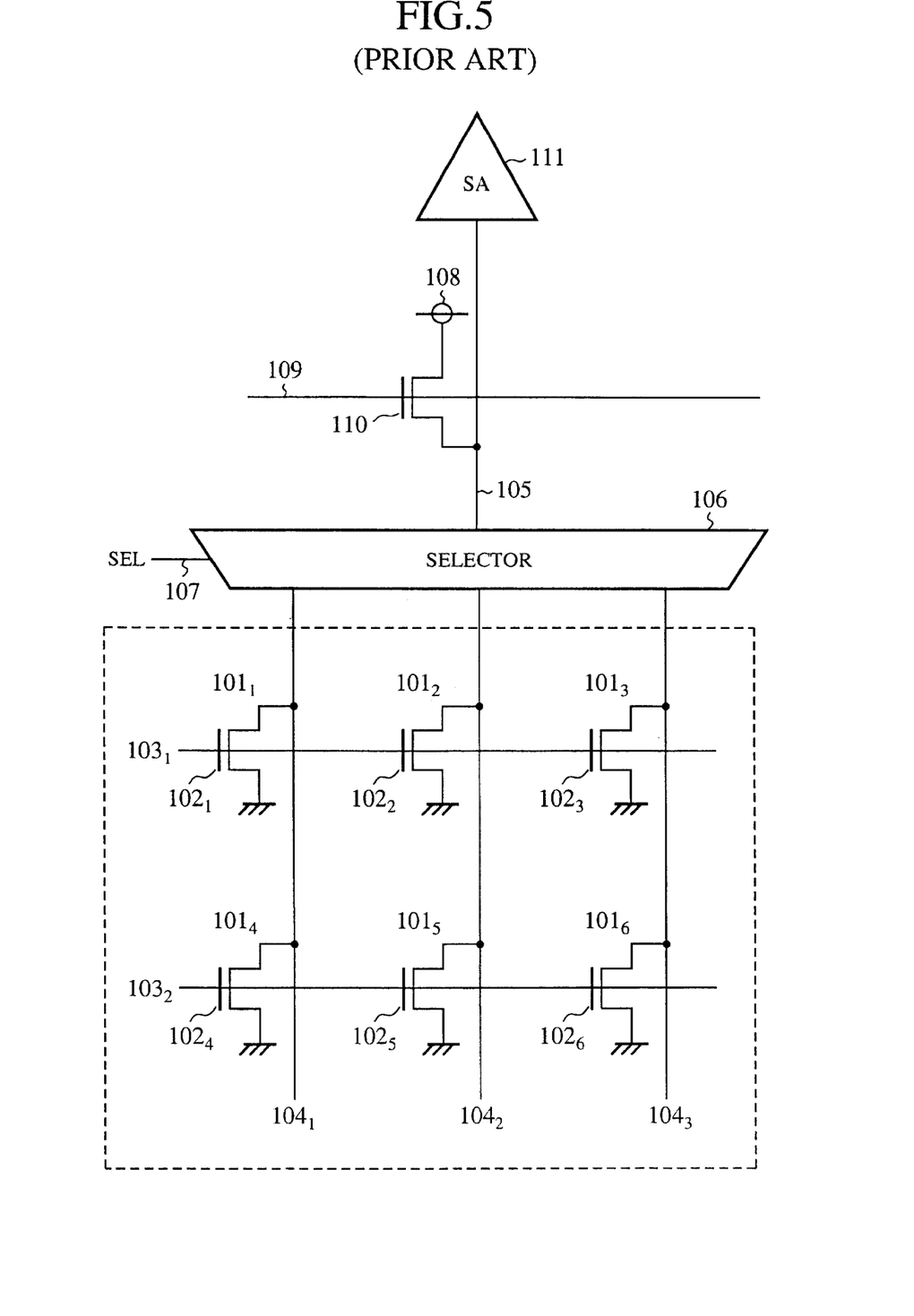
FIG. 5 is a circuit diagram showing one part of the conventional semiconductor Read Only Memory device.

FIG. 5 is a circuit diagram showing one part of a conventional ROM (Read Only Memory). In the figure, reference numerals 101 (i=1 to 6) denote memory cells. Note that although the memory cells $101_i$ are aligned in two lines and three columns in this figure, a plurality of memory cells $101_i$ are aligned in a matrix form in the longitudinal and lateral directions in accordance with the total memory capacity of the memory device itself in reality. Reference numerals $102_i$ (i=1 to 6) denote transistors each configuring the corresponding memory cell, numerals $103_i$ (i=1, 2) denote word lines which are connected to the gate of each of the transistors $102_i$ extending in the lateral direction, and numerals $104_i$ (i=1 to 3) denote bit lines which are extending along the transistors 102i aligned in the longitudinal direction and can be connected to the drain of each of the transistors $102_i$. Further, numeral 105 denotes an output line for reading data stored in the target memory cell, 106 denotes a selector for selecting the bit lines $104_i$ connected to the output line 105, 107 denotes a signal line for transmitting a control signal for controlling the selector 106, 108 denotes a voltage source, 109 denotes a signal line for transmitting a signal for controlling the precharging operation, 110 denotes a transistor, which is switched on and off in accordance with the control signal transmitted by way of the signal line 109 and provides electric current when precharging the output line 105 and the bit line $104_i$ selected by the selector 106, and 111 denotes a sense amplifier for converting the voltage to be fed to the output line 105 to that of the logic level in accordance with the data stored in the target memory cell.

Note that the source of each of the transistors $102_i$ is grounded, and that storing data in the ROM shown in FIG. 5 is carried out by connecting and/or disconnecting the drain of each of the transistors $102_i$ configuring the corresponding memory cell $101_i$, depending on whether the data to be stored is "0" or "1". In the ROM shown in FIG. 5, by connecting the drain of each of the transistors $102_1$, $102_3$, $102_4$, $102_5$ and $102_6$ to the respectively corresponding bit lines $104_i$, the binary data "0" (low potential VL) is stored, whereas by disconnecting, or releasing the drain of the transistor $102_2$ from the corresponding bit line $104_2$, the binary data "1" (high potential VH) is stored. The connection of the drain of each of the transistors with the corresponding bit line can be implemented by providing a through-hole between the drain and the corresponding bit line. Thus, forming or not forming the through-hole to each of the memory cells can be determined depending on what kind of data or program is to be stored in the ROM.

The operation of the conventional memory device is now explained below.

When reading a data, first a signal of "H" level is input to the signal line 109 to set ON the transistor 110, so as to precharge the output line 105 with a voltage in the region greater than the low potential VL but less than the high potential VH. Then, an appropriate signal is input to the signal line 107 thereby to connect the bit line $104_i$ related to a read target memory cell (here, the target memory cells are considered to be of limited numbers just for convenience) with the output line 105 by way of the selector 106, so as to precharge also the bit line $104_i$ with a voltage in the region greater than the low potential VL but less than the high potential VH, in addition to the output line 105i. After the selected bit line $104_i$ is precharged, the voltage of the corresponding word line $103_i$ related to the read target memory cell is set to the "H" level, and the transistor $102_i$ whose gate is connected to the thus selected word line 103 is set to ON. Concerning the read target memory cell, in the case where the drain of the ON-set transistor $102_i$ is connected to the corresponding bit line $104_i$ (namely the case of either one of the transistors $102_1$, $102_3$, $102_4$, $102_5$ and $102_6$), the precharged potential flows into the ground to thereby lower the potential of the corresponding bit line $104_i$. Further, in the case where the drain of the ON-set transistor $102_i$ is not connected to the corresponding bit line $104_i$ (namely the case of the transistors $102_2$), the potential of the corresponding bit line $104_i$ is not changed, and these changes of the potential are detected by the sense amplifier 111, and the voltage of the logic level corresponding to the data is output, depending on whether the binary data stored in each of the memory cells is "1" or "0".

Figure 6:
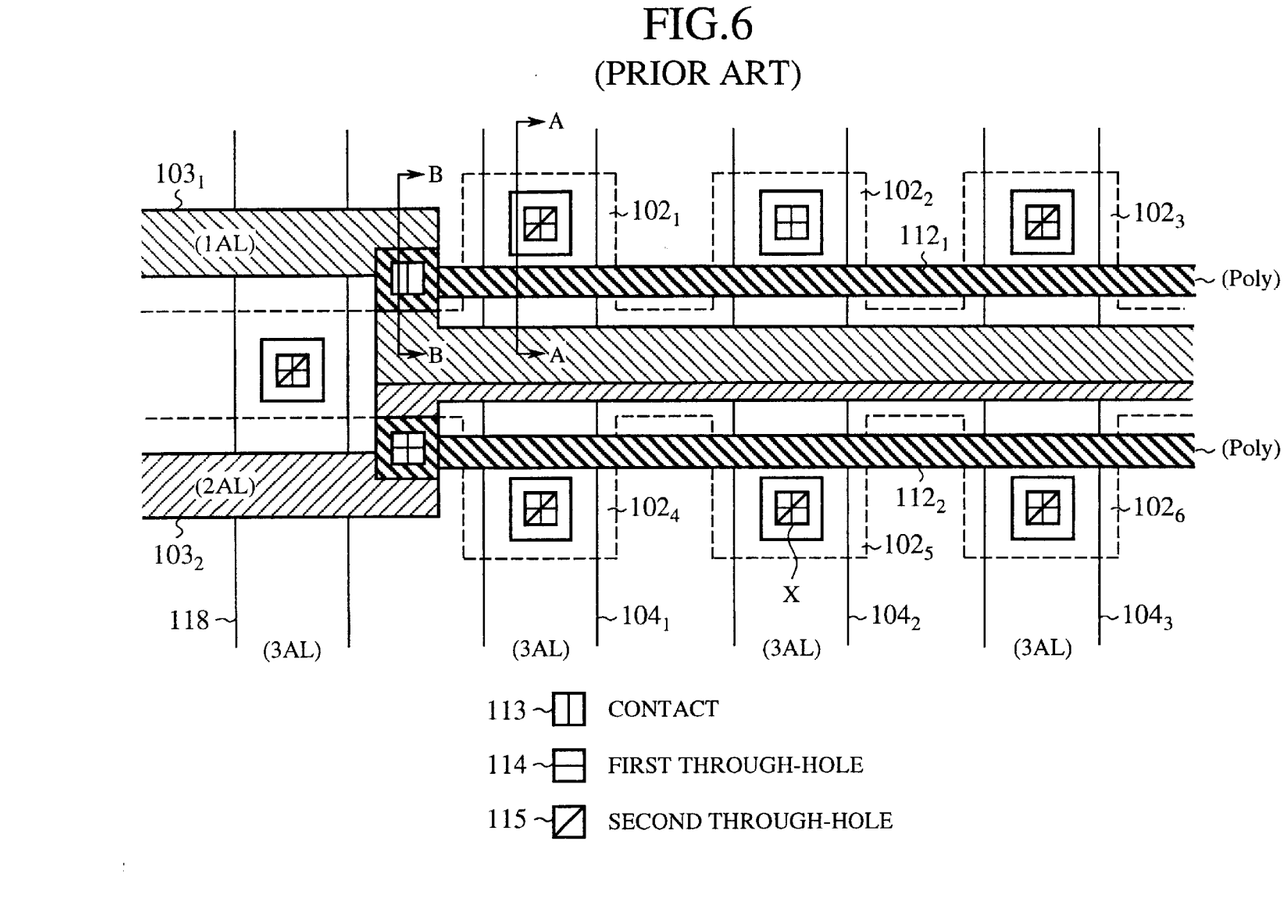
FIG. 6 is a plain view showing an example of the layout of one part of the conventional semiconductor Read Only Memory device.
Figure 7:
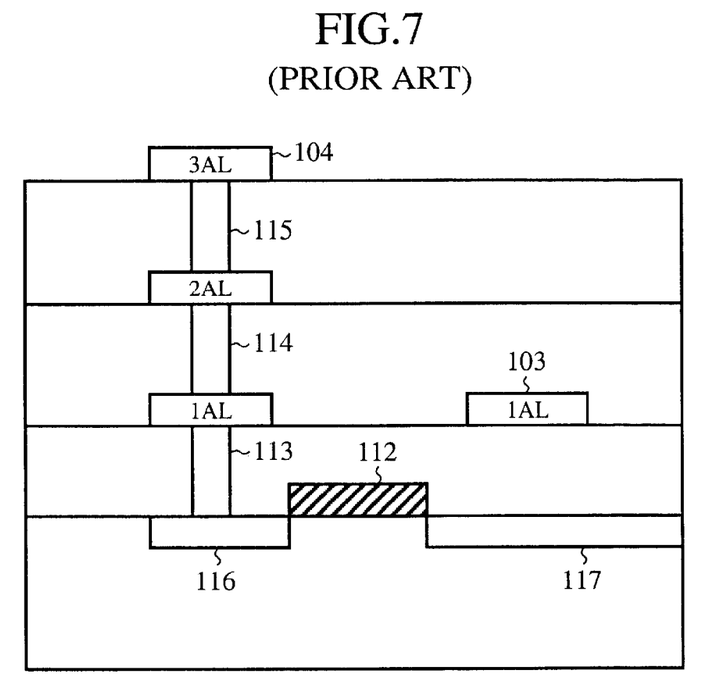
FIG. 7 is a schematic sectional view of the portion observed from the line cut along A—A of FIG. 6.
Figure 8:
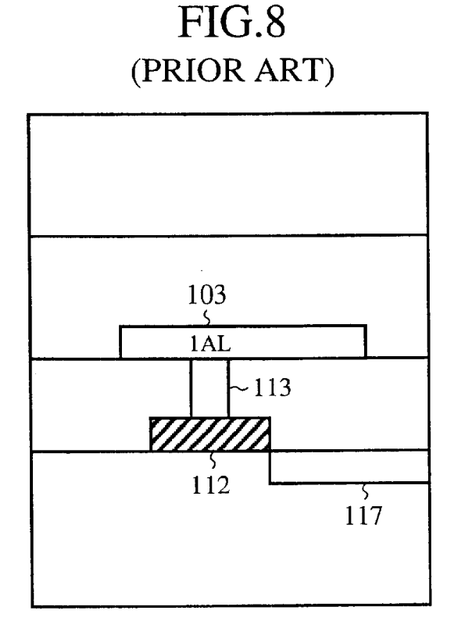
FIG. 8 is a schematic sectional view of the portion observed from the line cut along B—B of FIG. 6.

FIG. 6 is a plain view showing the layout regarding one part of the configuration of a conventional ROM. The layout shown in FIG. 6 corresponds to the portion enclosed by the dotted lines shown in FIG. 5. Further, FIG. 7 is a schematic sectional view regarding the portion observed from the line cut along A—A of FIG. 6, whereas FIG. 8 is a schematic sectional view regarding the portion observed from the line cut along B—B of FIG. 6. In these figures, reference numerals $112_1$ and $112_2$ denote gate sections made of Polysilicon (hereinafter referred to just as "poly"), each of which is common to the set of transistors $102_1$, $102_2$ and $102_3$, and to the set of $102_4$, $102_5$ and $102_6$, which are connected respectively to the word lines $103_1$ and $103_2$. Numeral 113 denotes a contact for connecting a first aluminum (1AL) and the poly or a substrate, 114 denotes a first through-hole for connecting the first aluminum (1AL) and a second aluminum (2AL), and 115 denotes a second through-hole for connecting the second aluminum (2AL) and a third aluminum (3AL). It should be noted that in the plain view of the layout shown in FIG. 6, an overlap of the contact 113, the first through-hole 114 and the second through-hole 115 is represented by the overlap of symbols indicating each of these members. For example, by the symbol denoted by a reference character X, it can be deduced that the contact 113 denoted by a longitudinal line, the first through-hole 114 denoted by a lateral line and the second through-hole 115 denoted by a rightwardly ascending slant line are aligned in the vertical direction. Further, numeral 116 denotes a drain, and 117 denotes a source, wherein one source is shared by every two word lines (for example, the word line $103_1$ and the word line $103_2$) concerning the transistors configuring the memory cells connected to these two corresponding word lines. Further, numeral 118 denotes a grounding line, and by connecting the source 117 to this ground lead 118, the source 117 can be grounded. Further, in FIG. 6, the portion enclosed by the dotted lines is a diffusion region, showing the area in which each of the transistors is formed.

Since the drain of the transistor $102_2$ configuring a memory cell is not formed with the second through-hole as indicated by the symbol of the corresponding portion, the drain of the transistor $102_2$ is not connected to the bit line $104_2$, but is made an open output. Further, the drain of each of the transistors $102_1$, $102_3$, $102_4$, $102_5$ and $102_6$ is, as shown by the symbol of the corresponding portion, formed with the second through-hole, so that the drain of each transistor is connected to the third aluminum (3AL), namely to the bit line $104_1$.

Since the conventional semiconductor memory device is configured as mentioned above, all the bit lines are configured by the metal lines in the same layer, and in accordance with a progress of the process integration, the space between mutually adjacent bit lines is made narrower, so that such a problem arises that the specific gravity of the coupling capacitance occupied within the whole bit-line capacitance is made large, so that an erroneous operation occurs due to this coupling capacitance.

SUMMARY OF THE INVENTION

The present invention has been proposed to solve the problems aforementioned, and it is an object of the present invention to provide a semiconductor memory device which is capable of reducing the coupling capacitance between mutually adjacent bit lines and thereby reducing the occurrence of erroneous operations.

In order to achieve the above object, a semiconductor memory device according to the first aspect of the present invention is configured in such a manner that it comprises a plurality of memory cells aligned in a matrix form, and a plurality of bit lines respectively extending along the memory cells aligned in the longitudinal direction, wherein each of the bit lines is provided with a line section of the upper layer and that of the lower layer, and that the mutually adjacent portions of the respectively adjacent two bit lines are provided in the different layers from each other.

A semiconductor memory device according to another aspect of the present invention is configured such that it comprises a plurality of memory cells aligned in a matrix form, and a plurality of bit lines respectively extending along the memory cells aligned in the longitudinal direction, wherein a line section for grounding (or just line grounding section) is disposed between the mutually adjacent bit lines.

A semiconductor memory device according to a further aspect of the present invention is constructed such that the bit lines and the line sections for grounding are provided in the same layers.

A semiconductor memory device according a slightly different aspect of the above is constructed such that the bit lines and the line sections for grounding are provided in the different layers.

A semiconductor memory device according further aspect of the present invention is configured such that it comprises a plurality of memory cells aligned in a matrix form, and a plurality of bit lines respectively extending along the memory cells aligned in the longitudinal direction, wherein the drain of all or some of the transistors configuring the memory cells in the area where no customer's program is stored (non-programmed area) are connected to the bit lines.

A semiconductor memory device according a further aspect of the present invention is constructed such that in the area where no customer's program is stored, the drain of of each of the transistors configuring the less number of memory cells than those connectable to the bit lines is connected to the corresponding bit line for obtaining the required reading speed margin per each bit line.

A semiconductor memory device according a still further aspect of the present invention is constructed such that it comprises a plurality of memory cells aligned in a matrix form, a plurality of bit lines respectively extending along the memory cells aligned in the longitudinal direction, an output means which is connected to either one of the bit lines and outputting a signal of the voltage level corresponding to the data stored in the selected memory cell, an inverting means which is connected to the data output line and inverting an input signal, a line section which is connected to the data output line in parallel to the inverting means, and a selection means for selecting either the inverting means or the line section to which the output means is to be connected.

A semiconductor memory device according a still further aspect of the present invention is constructed such that it comprises a plurality of memory cells aligned in a matrix form, and a plurality of bit lines respectively extending along the memory cells aligned in the longitudinal direction, wherein selectively one or plural bit lines are formed in the layer which is different from that where other bit lines are formed.

DETAILED DESCRIPTION OF THE PREFERRED EMBODIMENTS

Several embodiments of the present invention are now explained hereinafter.

First Embodiment

Figure 1:
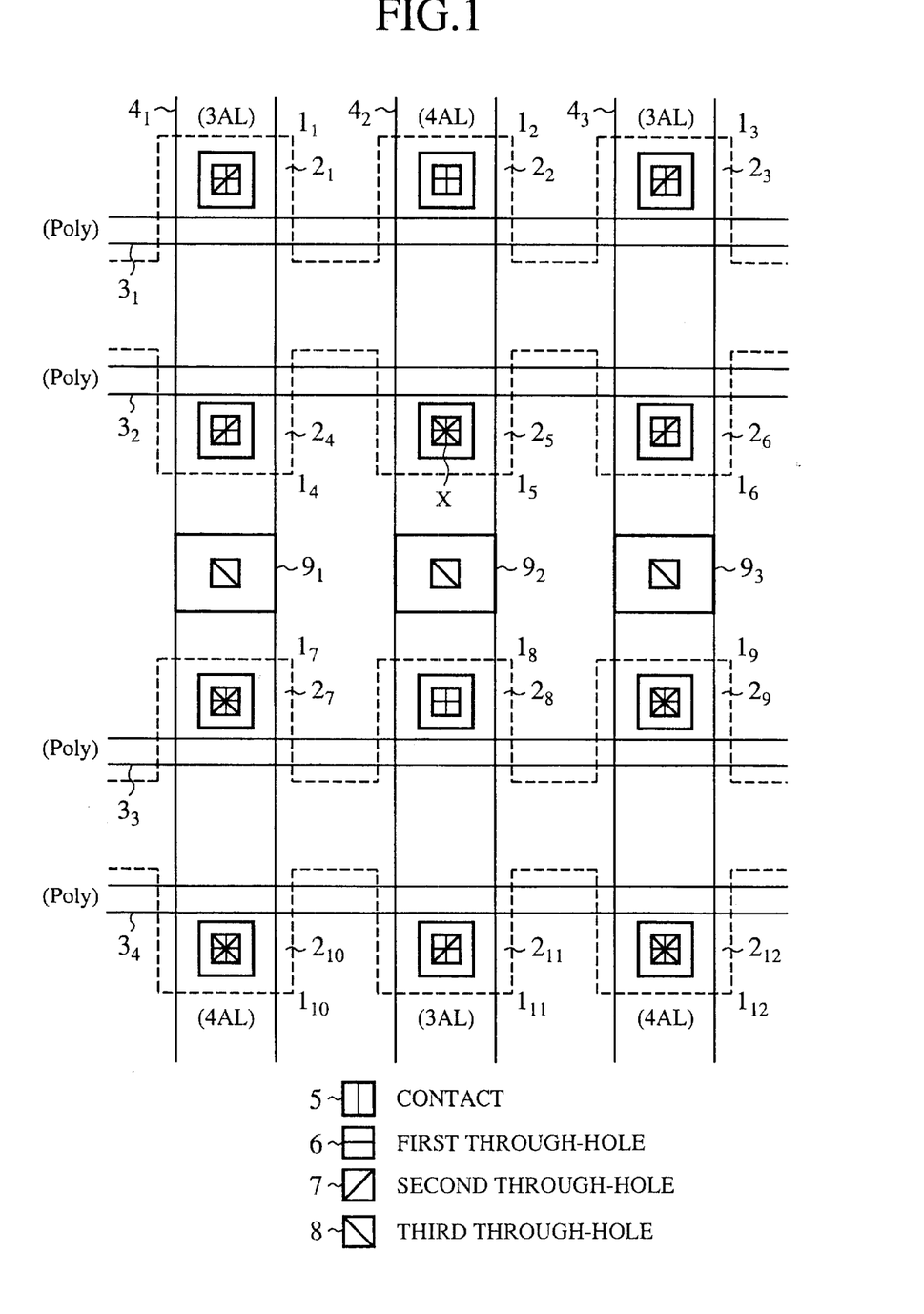
FIG. 1 is a plain view of a layout of one part of a semiconductor memory device according to a first embodiment of the present invention.

FIG. 1 is a plain view showing the layout of one part of the semiconductor memory device according to a first embodiment of the present invention. In FIG. 1, numerals $1i$ (i=1 to 12) denote memory cells which are aligned in a matrix shape configuring together the memory device, numerals $2i$ (i=1 to 12) denote transistors each configuring the corresponding memory cell, numerals $3i$ (i=1 to 4) denote gate portions commonly provided to each of the laterally aligned transistors $2i$, and numerals $4i$ (i=1 to 3) denote bit lines which are extending along the longitudinally aligned transistors $2i$ and capable of being connected to the drain of each of these transistors $2i$. Further, numeral 5 denotes a contact for connecting a first aluminum (1AL) with a poly or a substrate, numeral 6 denotes a first through-hole for connecting the first aluminum (1AL) with a second through-hole (2AL), numeral 7 denotes a second through-hole for connecting the second aluminum (2AL) with a third through-hole (3AL), numeral 8 denotes a third through-hole for connecting the third aluminum (3AL) with a fourth through-hole (4AL), and numerals $9i$ (i=1 to 3) denote connecting portions provided to each of the bit lines $4i$ and connecting the portion formed in the third aluminum with the portion formed in the fourth aluminum. Note that in the plain view shown in FIG. 1, an overlap of the contact 5, the first through-hole 6, the second through-hole 7 and the third through-hole 8 is represented by an overlap of symbols indicating each of these members. For example, by dint of the symbol denoted by the character X, it is recognized that the contact 5 denoted by a longitudinal line, the first through-hole 6 denoted by a lateral line, the second through-hole 7 denoted by a rightwardly ascending line and the third through-hole denoted by a rightwardly descending line are aligned in the vertical direction. Further, in FIG. 1, the area enclosed by the dotted lines is a diffusion region, showing the area in which each of the transistors is formed.

Further, as shown in FIG. 1, each of the bit lines $4i$ comprises an aluminum line (line section) of the upper layer (4AL) and another line of the lower layer (3AL), whereas between mutually adjacent bit lines, it is arranged such that the mutual adjacent portions of the respective aluminum lines are provided in the different layers. It is preferable that each of the bit lines is configured by a 50% upper-layer aluminum line and a 50% lower-layer aluminum line. Further by equalizing the line capacitance of each of the bit lines, inconsistency of reading characteristic can be suppressed.

As explained above, according to the first embodiment of the present invention, each of the bit lines is provided with a line section of the upper layer and that of the lower layer, and it is arranged such that between mutually adjacent bit lines, the mutually adjacent portions of the respective aluminum lines are in the different layers, so that the coupling capacitance between mutually adjacent bit lines can be reduced, and the occurrence of erroneous operations at the data reading due to the appearance of the coupling capacitance can be thereby suppressed.

It should be noted that the combination of the aluminum line of the upper layer and that of the lower layer is not limited to the combination of the third aluminum (3AL) and the fourth aluminum (4AL), g-but various combinations can be considered. For example, in FIG. 1, if the configuration is such that the second aluminum (2AL) is not used for piling the word line connected to the gate section $3i$, then such a configurations is also made possible that the third aluminum (3AL) is used for an aluminum line of the upper layer configuring the bit line, and the second aluminum (2AL) is used for an aluminum line of the lower layer.

Second Embodiment

Figure 2:
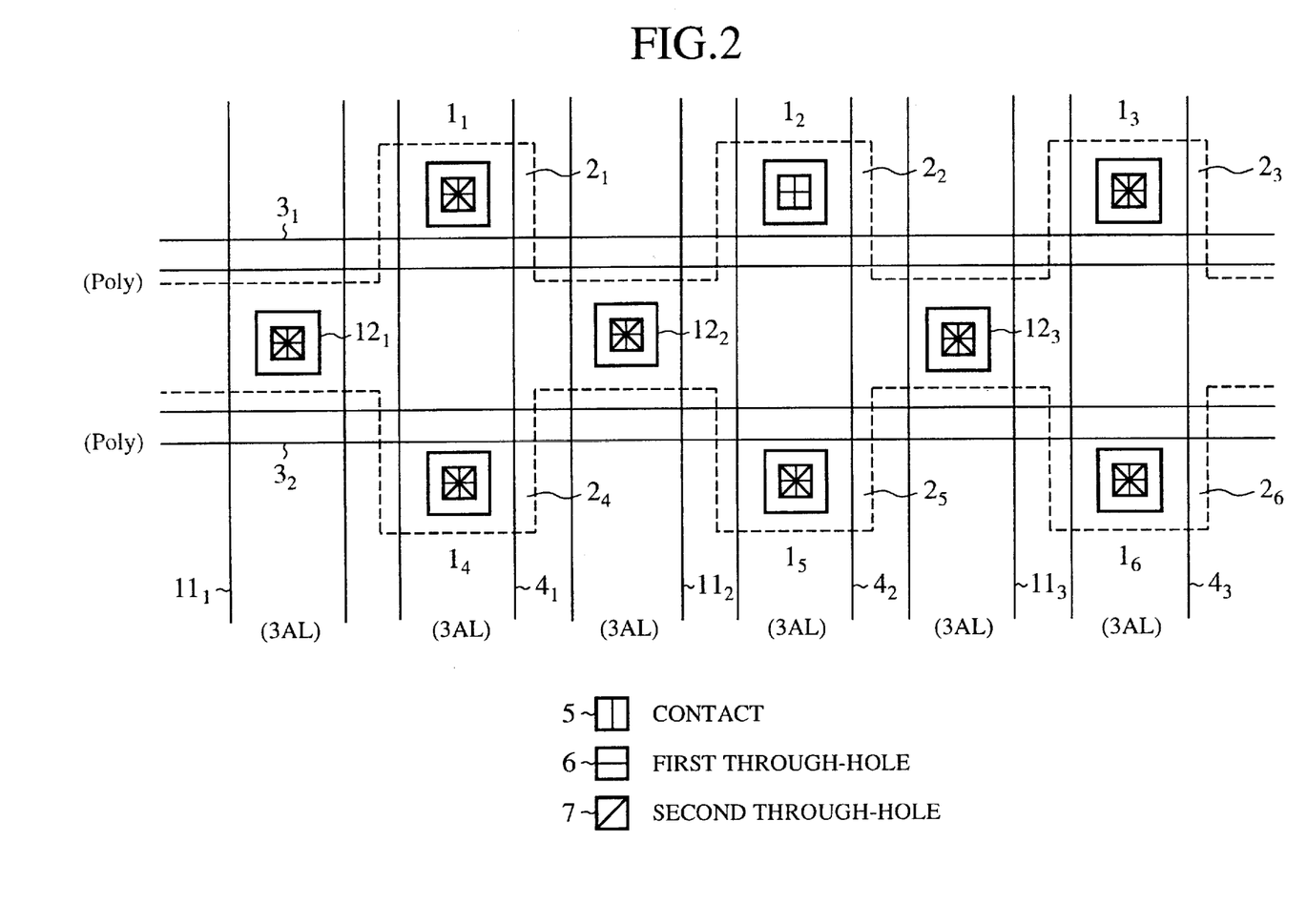
FIG. 2 is a plain view of a layout of one part of a semiconductor memory device according to a second embodiment of the present invention.

FIG. 2 is a plain view of a layout of one part of a semiconductor memory device according to a second embodiment of the present invention. In the figure, since the same reference numerals correspond to the same portions, the detailed explanation thereabout is omitted here. Reference numerals $11i$ (i=1 to 3) denote aluminum lines for grounding (ground-use line section or just grinding line section) disposed between mutually adjacent bit lines $4i$ in the mutually same layers of the respective bit lines $4i$, numerals $12i$ (i=1 to 3) denote source grounding sections for connecting the sources shared by adjacent transistors $2i$ to the grounding aluminum lines $11i$.

As explained above, according to the second embodiment of the present invention, the grounding aluminum lines $11i$ formed in the same layer are disposed between mutually adjacent bit lines, so that the coupling capacitance between the adjacent bit lines can be suppressed to the level almost none, and thus occurrence of erroneous operations at the data reading due to the appearance of the coupling capacitance can be greatly suppressed. Still further, since the sources of the transistors configuring each of the memory cells can be connected to the grounding aluminum line $11i$ disposed between mutually adjacent bit lines $4i$, and thereby the source of the transistor of each of the memory cells can be firmly grounded, deterioration of the reading characteristic due to a rise of the source potential can be reduced.

Note that in this second embodiment, the grounding aluminum lines $11i$ are formed in the same line layers of the respective bit lines $4i$. However, as long as the grounding aluminum lines $11i$ are disposed between the respective adjacent bit lines $4i$, each of the grounding aluminum lines $11i$ can be disposed in the line layer different from that of the adjacent bit lines $4i$, and in this case also, the occurrence of erroneous operations at the data reading due to the appearance of the coupling capacitance can be suppressed.

Further, even in the case where each bit line is provided with a line section formed in a plurality of layers as shown in FIG. 1, if the grounding aluminum line is disposed between mutually adjacent bit lines, the coupling capacitance can further be removed, so that the occurrence of erroneous operations at the data reading can be further suppressed.

It is to be noted that the first and second embodiments have been explained about a mask ROM that determines whether to store data or not depending on whether a through-hole is provided. However, as long as such a construction is adopted that a plurality of bit lines are connectablly extending along the memory cells aligned in the longitudinal direction within the memory cells aligned in a matrix form, these first and the second embodiments can be applied even to a semiconductor memory device of other constructions.

Third Embodiment

Figure 3:
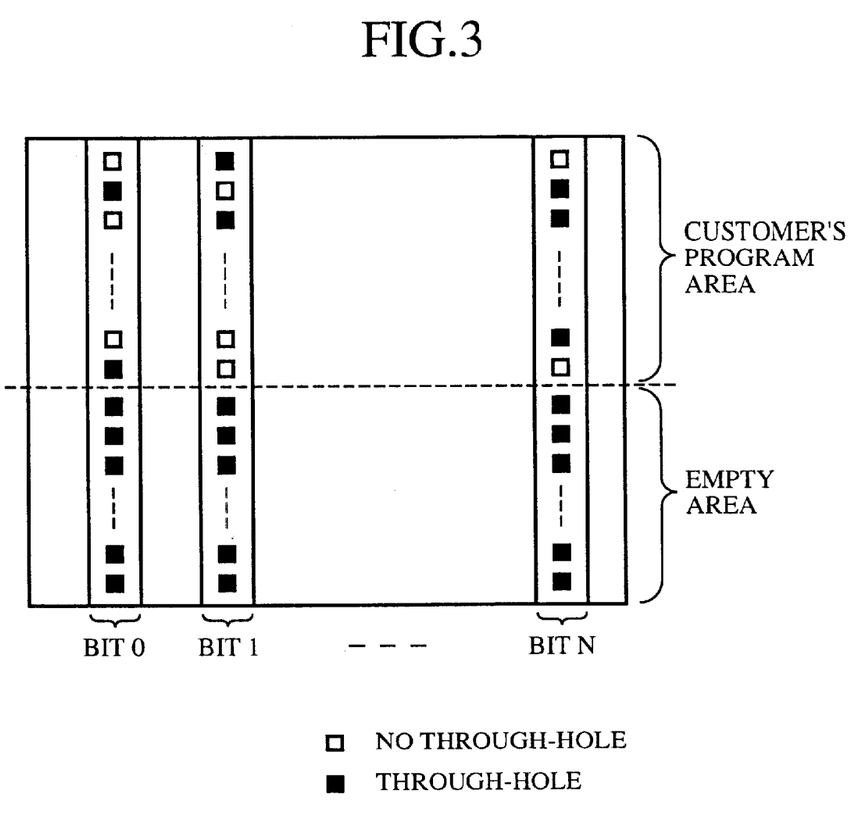
FIG. 3 is an illustration showing the state in which data is stored in the memory area of the semiconductor memory device according to a third embodiment of the present invention.

The semiconductor memory device according to a third embodiment is characterized in that by forming a through-hole to the drain of each of the transistors configuring all the memory cells in the area in which no customer's program is programmed, these drains are connected to the corresponding bit lines. This third embodiment explains about a ROM that registers data in the memory cells depending on whether through-holes are formed to these memory cells. FIG. 3 is an illustration showing the state in which the data are stored in the memory area of the semiconductor memory device according to the third embodiment of the present invention. Note that the customer's program means a program data which is composed by a customer and programmed into a mask ROM.

As shown in FIG. 3, the whole ROM area is divided into a customer's program area and a non-programmed area (hereinafter referred to just as an "empty area"). In the customer's program area, "0" and "1" correspond either to "provide through-hole" or "not provide through-hole", whereas through-holes can be freely formed applied in the empty area. In this third embodiment, all the memory cells are formed with through-holes in order to enlarge the capacitance of each of the bit lines.

The relationship between the provision of a through-hole and the line capacitance of a bit line is explained here. When a through-hole is formed, a bit line and the drain of a transistor configuring each memory cell are connected to each other, so that the whole drain capacitance related to the bit lines is increased by the number of memory cells whose drains are connected to the bit lines by way of the through-holes, thereby to increase the total line capacitance.

Next, the change in the influence of the appearance of the coupling capacitance between mutually adjacent bit lines with respect to the change in the whole capacitance related to the bit lines is explained. The influence due to the appearance of the coupling capacitance means that a target bit line is affected by the change in the potential of its adjacent bit line due to the coupling capacitance between the target bit line and its adjacent bit line (capacitance between adjacent bit lines). The influence of this appearance of the coupling capacitance is enlarged in the case where the coupling capacitance between mutually adjacent bit lines is large, and also in the case where the change in the potential of the adjacent bit line is abrupt. Thus, in the case where the line capacitance of the adjacent bit line is large, the change in the potential is made gentle in comparison with the case where it is small, and the influence of the appearance of the coupling capacitance is also made small. Further, the larger the capacitance related to the target bit line becomes, the less influence with respect to the potential change of its adjacent bit line the target bit line itself is likely to receive. Due to all this above, by enlarging the line capacitance of bit lines through provision of through-holes, the influence of the appearance of the coupling capacitance between mutually adjacent bit lines can be reduced, and thus erroneous operations at the time of data reading can be reduced.

As explained heretofore, according to this third embodiment, since it is constructed such that by forming a through-hole to the drain of each of the transistors configuring all the memory cells in the area in which no customer's program is programmed, these drains are connected to the corresponding bit lines, so that the line capacitance of each bit line is made large to thereby enable the reduction of influence of the appearance of the coupling capacitance between mutually adjacent bit lines, and thus erroneous operations at the time of data reading can be reduced.

Fourth Embodiment

The semiconductor memory device according to a fourth embodiment is characterized in that within the empty area where no customer's program is stored, the reading speed margin is first evaluated, and a memory cell to the drain of which a through-hole is applied is selected in accordance with the thus evaluated reading speed margin. Here, the reading speed margin means a margin for the actual reading rate of the ROM with respect to the operation specification of a product. The fact that the reading speed margin is small means that the ROM reading speed is only a bit faster than the product specification, and no superfluous margin is prepared, whereas the fact that the reading margin is large means that the ROM reading speed is much faster than the product specification, and a sufficient margin is prepared.

If the line capacitance is large, the influence of the appearance of the coupling capacitance is reduced as mentioned before, but its reading speed becomes lower. Thus, the number of memory cells to the drain of each of which a through-hole is formed should be selected in the range in which no customer's program is stored within the scope in which the reading speed required for each bit line is secured, after evaluating the reading speed margin of the target ROM.

As explained above, according to this fourth embodiment, it is constructed such that in the range where no customer's program is stored, the drain of transistors configuring the memory cells less than the number of memory cells connectable to the bit lines is connected to the respective bit lines for obtaining the required reading speed margin per each bit line, whereby a required reading speed margin can be obtained, and the influence of the appearance of the coupling capacitance between mutually adjacent bit lines is reduced by enlarging the line capacitance of the bit lines, so that the occurrence of erroneous operations at the time of data reading can be reduced.

Fifth Embodiment

Figure 4:
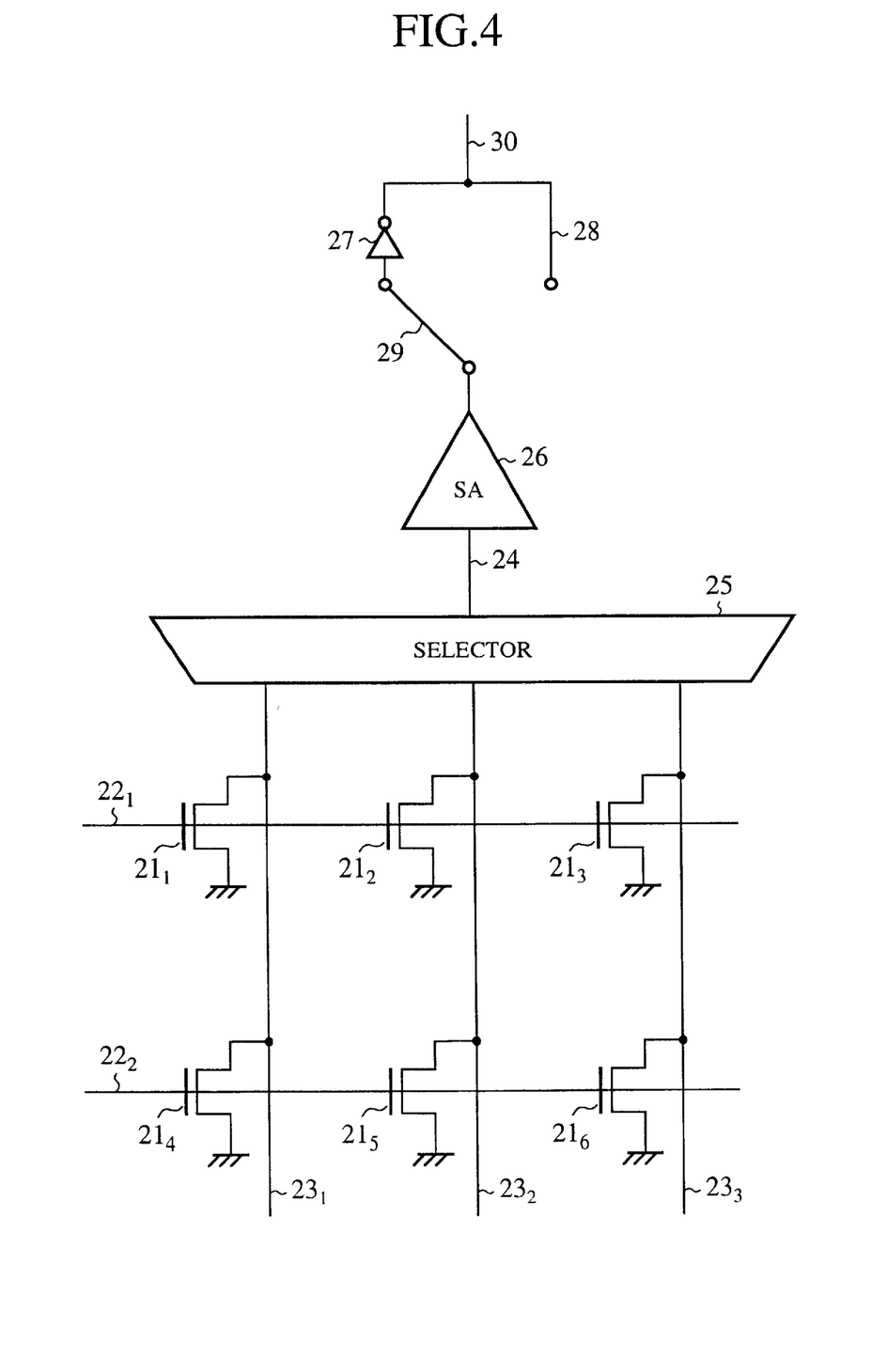
FIG. 4 is a schematic diagram showing the configuration of a semiconductor memory device according to a fifth embodiment of the present invention.

FIG. 4 is a schematic diagram showing the configuration of a semiconductor memory device according to a fifth embodiment of the present invention. In the figure, numerals $21i$ (i=1 to 6) denote transistors each configuring the corresponding memory cell, numerals $22i$ (i=1 and 2) denote word lines which are connected to the gate of the transistors $21i$ (i=1 to 3) aligned in the lateral direction and extending therealong, and numerals $23i$ (i=1 to 3) denote bit lines which are extending along the transistors $21i$ in the longitudinal direction and connectable to the drain of those transistors $21i$. Further, numeral 24 denotes a signal line for reading the data of a target memory cell, 25 denotes a selector for selecting one of the bit lines $23i$ connected to the signal line 24, 26 denotes a sense amplifier (output means) for converting the voltage output to the signal line 24 to that of the logic level in accordance with the data stored in each of the memory cells, 27 denotes an inverter (inverting means), 28 denotes a line section provided in parallel to the inverter 27, 29 denotes a selector for selecting either connecting the sense amplifier 26 to the inverter 27 or to the line section 28, and numeral 30 denotes a data output line which is connected both to the inverter 27 and to the line section 28. Note that this fifth embodiment explains about the mask ROM that register data or a program into memory cells, depending on the presence or absence of the through-holes.

In a mask ROM having a normal construction, whether the through-hole is formed or not only corresponds to either one of "0" and "1" of the customer's program data. For example, it is assumed that the "presence" of the through-hole corresponds to the binary value "0", whereas the "absence" of the through-hole corresponds to the binary value "1". In this circuit configuration, if there are many of data "1" in the customer's program data, the line capacitance related to the bit lines is made small as a whole. Thus, when there are many of data "0", each of the data is stored in the corresponding memory cell as it is, and at the same time the sense amplifier 26 is connected to the line section 28 by way of the selector 29 and directly output the data stored in the memory cells. On the other hand, when there are many of data "1", each of the data is inverted and stored in each of the corresponding memory cells, and at the same time the sense amplifier 26 is connected to the inverter 27 by way of the selector 29 and output the data stored in the memory cells after inverting it. By arranging the circuit configuration as such, the total line capacitance related to the bit lines can be enlarged as a whole by increasing the number of data "0", namely the number of memory cells having the "presence" of through-holes within the customer's program data with respect to the customer's program with any kind of data configuration.

As explained above, since the semiconductor memory device according to this fifth embodiment is constructed such that it comprises the sense amplifier 26 for outputting the data of memory cells, the inverter 27 connected to the data output line 30, the line section 28 connected to the output line 30 in parallel to the inverter 27, and also the selector 29 for selecting either to connect the sense amplifier 26 to the inverter 27, or to the line section 28, it is possible to enlarge the line capacitance related to the bit lines by increasing the number of data corresponding to the "presence" of the through-holes within the customer's program data, the influence of the appearance of the coupling capacitance is reduced, thereby to reduce the erroneous operation at the time of data reading.

Sixth Embodiment

The semiconductor memory device according to the present invention is characterized in that the bit lines are formed in the different line layers selectively. Specially, by forming one or more bit lines required for high-speed reading in a line layer which is different from that in which other bit lines are formed, the influence of the appearance of the coupling capacitance between mutually adjacent bit lines is reduced to thereby enable the high-speed reading, so that the occurrence of an erroneous operation at the time of reading can be greatly reduced.

As explained heretofore, according to the present invention, the semiconductor memory device is configured in such a manner that it comprises a plurality of memory cells aligned in a matrix form, and a plurality of bit lines respectively extending along the memory cells aligned in the longitudinal direction, wherein each of the bit lines is provided with a line section of the upper layer and that of the lower layer, and that the mutually adjacent portions of the respectively adjacent two bit lines are provided in the different layers from each other, so that the coupling capacitance between mutually adjacent bit lines can be reduced, and occurrence of erroneous operations at the data reading due to the appearance of the coupling capacitance can be suppressed.

Further, according to the present invention, the semiconductor memory device is configured such that it comprises a plurality of memory cells aligned in a matrix form, and a plurality of bit lines respectively extending along the memory cells aligned in the longitudinal direction, wherein a line section for grounding (or just line grounding section) is disposed between mutually adjacent bit lines, so that the coupling capacitance between mutually adjacent bit lines can be greatly reduced, and thus occurrence of erroneous operations at the data reading due to the capacity coupling phenomenon can be greatly suppressed. In addition, since the source of the transistors configuring each of the memory cells can be connected to the grounding line section disposed between the adjacent bit lines 4*i*, and thereby the source of the transistor of each of the memory cells can be firmly grounded, deterioration of the reading characteristic due to a rise of the source potential can be reduced.

Further, according to the present invention, since it is constructed such that the bit lines and the grounding line sections are provided in the same layers, the coupling capacitance between mutually adjacent bit lines can be greatly reduced to the level almost none, and thus occurrence of erroneous operations at the data reading due to the appearance of the coupling capacitance can be greatly suppressed.

Further, since the semiconductor memory device according to the present invention is configured such that it comprises a plurality of memory cells aligned in a matrix form, and a plurality of bit lines respectively extending along the memory cells aligned in the longitudinal direction, wherein the drain of all or some of the transistors configuring the memory cells in the area where no customer's program is stored (non-programmed area) are connected to the bit lines, to thereby connect each of the drains with the bit lines, so that the line capacitance of each bit line is made large to thereby enable the reduction of influence of the appearance of the coupling capacitance between the bit lines, and thus erroneous operations at the time of data reading can be reduced.

Still further, according to the present invention, it is constructed such that in the area where no customer's program is stored, the drain of each of the transistors configuring the less number of memory cells than those connectable to the bit lines is connected to the corresponding bit line for obtaining the required reading speed margin per each bit line, whereby a required reading speed margin can be obtained and the influence of the appearance of the coupling capacitance between mutually adjacent bit lines is reduced by enlarging the line capacitance of the bit lines, so that the occurrence of erroneous operations at the time of data reading can be reduced.

Still further, since the semiconductor memory device according to the present invention is constructed such that it comprises a plurality of memory cells aligned in a matrix form, a plurality of bit lines respectively extending along the memory cells aligned in the longitudinal direction, an output means which is connected to either one of the bit lines and outputting a signal of the voltage level corresponding to the data stored in the selected memory cell, an inverting means which is connected to the data output line and inverting an input signal, a line section which is connected to the data output line in parallel to the inverting means, and a selection means for selecting either the inverting means or the line section to which the output means is to be connected. Due to this construction, it is possible to enlarge the line capacitance related to the bit lines by increasing the number of data corresponding to the "presence" of the through-hole within the customer's program data, the influence of the appearance of the coupling capacitance is reduced thereby to reduce the erroneous operation at the time of data reading.

Yet still further, since the semiconductor memory device according to the present invention is constructed such that it comprises a plurality of memory cells aligned in a matrix form, and a plurality of bit lines respectively extending along the memory cells aligned in the longitudinal direction, wherein selectively one or a plurality of bit lines are formed in the layer which is different from that in which other bit lines are formed, so that if the bit lines requiring a high-speed reading are formed in the layer different from the one in which other bit lines are formed, a required reading speed margin can be obtained, whereby the influence of the appearance of the coupling capacitance between mutually adjacent bit lines is reduced, and the erroneous operations at the time of data reading can thereby be reduced.

What is claimed is:

1. A semiconductor memory device comprising:
   a plurality of memory cells aligned in a matrix form, and
   a plurality of bit lines respectively extending along the memory cells aligned in the longitudinal direction,
   wherein each of the bit lines is provided with a line section of the upper layer and that of the lower layer, and the mutually adjacent portions of the respectively adjacent two bit lines are provided in the different layers from each other.

2. A semiconductor memory device comprising:
   a plurality of memory cells aligned in a matrix form,
   a plurality of bit lines respectively extending along the memory cells aligned in the longitudinal direction, and a grounding line section disposed between each pair of adjacent two bit lines.

3. The semiconductor memory device according to claim 2, wherein the bit lines and the grounding line sections are provided in the same layers.

4. The semiconductor memory device according to claim 2, wherein the bit lines and the grounding line sections are provided in the different layers from each other.

5. A semiconductor memory device comprising:

a plurality of memory cells aligned in a matrix form, and a plurality of bit lines respectively extending along the memory cells aligned in the longitudinal direction, wherein the drain of all or some of the transistors configuring the memory cells in the area where no customer's program is stored are connected to the bit lines.

6. The semiconductor memory device according to claim 5, wherein in the area where no customer's program is stored, the drain of each of the transistors configuring the less number of memory cells than those memory cells connectable to the bit lines is connected to the corresponding bit line for obtaining the required reading speed margin per each bit line.

7. A semiconductor memory device comprising:

a plurality of memory cells aligned in a matrix form, and a plurality of bit lines respectively extending along the memory cells aligned in the longitudinal direction, wherein selectively one or a plurality of bit lines are formed in the layer which is different from the one in which other bit lines are formed.

* * * * *